(12) United States Patent
Fogel et al.

(10) Patent No.: US 9,876,129 B2
(45) Date of Patent: Jan. 23, 2018

(54) CONE-SHAPED HOLES FOR HIGH EFFICIENCY THIN FILM SOLAR CELLS

(75) Inventors: Keith E. Fogel, Hopewell Junction, NY (US); Augustin J. Hong, White Plains, NY (US); Jeehwan Kim, Los Angeles, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 971 days.

(21) Appl. No.: 13/468,266

(22) Filed: May 10, 2012

(65) Prior Publication Data

US 2013/0298980 A1 Nov. 14, 2013

(51) Int. Cl.
| | |
|---|---|
| *H01L 31/0236* | (2006.01) |
| *H01L 31/0368* | (2006.01) |
| *H01L 31/0376* | (2006.01) |
| *H01L 31/047* | (2014.01) |
| *H01L 31/046* | (2014.01) |
| *H01L 31/075* | (2012.01) |
| *H01L 31/18* | (2006.01) |

(52) U.S. Cl.
CPC ...... *H01L 31/02366* (2013.01); *H01L 31/046* (2014.12); *H01L 31/047* (2014.12); *H01L 31/075* (2013.01); *H01L 31/18* (2013.01); *Y02E 10/50* (2013.01); *Y10T 428/24479* (2015.01)

(58) Field of Classification Search
CPC ............. H01L 31/03682; H01L 31/03762
See application file for complete search history.

(56) References Cited

U.S. PATENT DOCUMENTS

| | | | | |
|---|---|---|---|---|
| 4,612,409 | A * | 9/1986 | Hamakawa | H01L 31/03921 136/244 |
| 5,948,176 | A * | 9/1999 | Ramanathan | H01L 31/0323 136/264 |
| 6,123,824 | A * | 9/2000 | Sano et al. | 205/124 |
| 6,231,428 | B1 * | 5/2001 | Maloney | B24B 49/16 451/287 |
| 6,331,672 | B1 * | 12/2001 | Matsuda et al. | 136/256 |
| 6,380,480 | B1 * | 4/2002 | Norimatsu et al. | 136/256 |
| 7,589,880 | B2 | 9/2009 | Kempa et al. | |
| 7,634,162 | B2 | 12/2009 | Kempa et al. | |
| 7,740,713 | B2 | 6/2010 | Duchesne et al. | |
| 7,999,353 | B1 | 8/2011 | Odom et al. | |
| 2007/0047056 | A1 | 3/2007 | Kempa et al. | |

(Continued)

OTHER PUBLICATIONS

Jennifer "Focaccia con rosmarino del giardino" http://commons.wikimedia.org/wiki/File:Focaccia_con_rosmarino_del_giardino.jpg, published Jan. 7, 2007, retrieved Apr. 17, 2015.*

(Continued)

*Primary Examiner* — Magali P Slawski
(74) *Attorney, Agent, or Firm* — Tutunjian & Bitetto, P.C.; Louis J. Percello

(57) ABSTRACT

A photovoltaic device includes a substrate having a plurality of hole shapes formed therein. The plurality of hole shapes each have a hole opening extending from a first surface and narrowing with depth into the substrate. The plurality of hole shapes form a hole pattern on the first surface, and the hole pattern includes flat areas separating the hole shapes on the first surface. A photovoltaic device stack is formed on the first surface and extends into the hole shapes. Methods are also provided.

20 Claims, 5 Drawing Sheets

(56) References Cited

U.S. PATENT DOCUMENTS

| | | | |
|---|---|---|---|
| 2007/0137697 A1 | 6/2007 | Kempa et al. | |
| 2008/0099785 A1 | 5/2008 | Bai et al. | |
| 2009/0120490 A1 | 5/2009 | Huang et al. | |
| 2009/0133751 A1 | 5/2009 | Sreenivasan et al. | |
| 2009/0205709 A1* | 8/2009 | Kim | H01L 31/022425 136/256 |
| 2009/0260678 A1* | 10/2009 | Di Stefano | H01L 31/022425 136/252 |
| 2009/0296189 A1 | 12/2009 | Black et al. | |
| 2009/0314333 A1* | 12/2009 | Shepard | G02B 6/04 136/248 |
| 2010/0071760 A1 | 3/2010 | Kwok et al. | |
| 2010/0224249 A1* | 9/2010 | Fukunaga | C25D 11/04 136/259 |
| 2010/0240167 A1 | 9/2010 | Dasgupta et al. | |
| 2010/0252109 A1* | 10/2010 | Hong | H01L 31/022425 136/261 |
| 2010/0288350 A1* | 11/2010 | Lee | H01L 31/02366 136/256 |
| 2010/0323165 A1* | 12/2010 | Sakuma | G02B 1/118 428/167 |
| 2011/0030770 A1 | 2/2011 | Sreenivasan et al. | |
| 2011/0284061 A1 | 11/2011 | Vanecek et al. | |
| 2012/0017969 A1* | 1/2012 | Yuuya | H01L 31/0392 136/244 |
| 2012/0088106 A1* | 4/2012 | Jing | B82Y 30/00 428/426 |
| 2012/0183734 A1* | 7/2012 | Schiavoni | G02B 5/02 428/156 |

OTHER PUBLICATIONS

Collins English Dictionary "Convex". 2014. In Collins English Dictionary, edited by Collins Dictionaries. London: Collins. http://search.credoreference.com/content/entry/hcengdict/convex/0.*

Hong, A., et al. "Metal Nanodot Memory by Self-Assembled Block Copolymer Lift-Off" Nano Letters. Dec. 2009. pp. 224-229.

Knizilevicius, R. "Simulation of Si and SiO2 Etching in CF4 Plasma" Vacuum 82, 2008. pp. 1191-1193.

Zhu, J., et al. "Optical Absorption Enhancement in Amorphous Silicon Nanowire and Nanocone Arrays" Nano Letters. vol. 9, No. 1. Dec. 2008. pp. 279-282.

Wang, H., et al. "Three-Dimensional Electrodes for Dye-Sensitized Solar Cells: Synthesis of Indium-Tin-Oxide Nanowire Arrays and Ito/TiO2 Core-Shell Nanowire Arrays by Electrophoretic Deposition" Nanotechnology. vol. 20, No. 5. Jan. 2009. pp. 1-9.

* cited by examiner

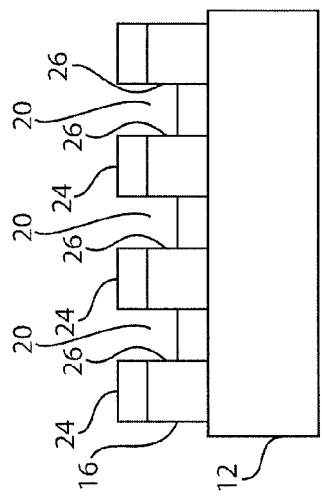
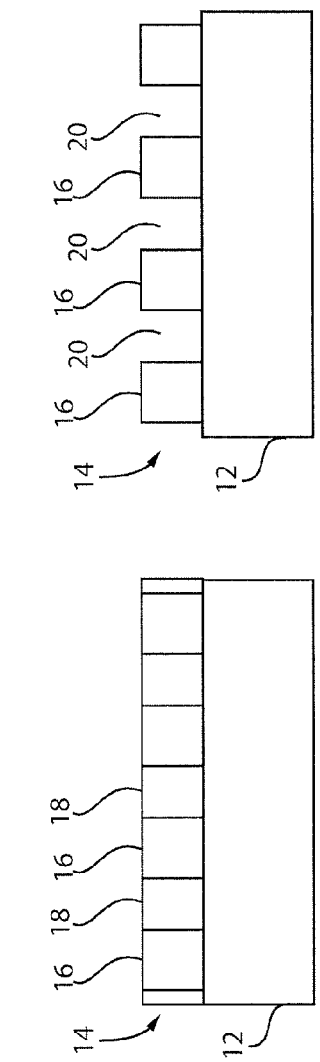
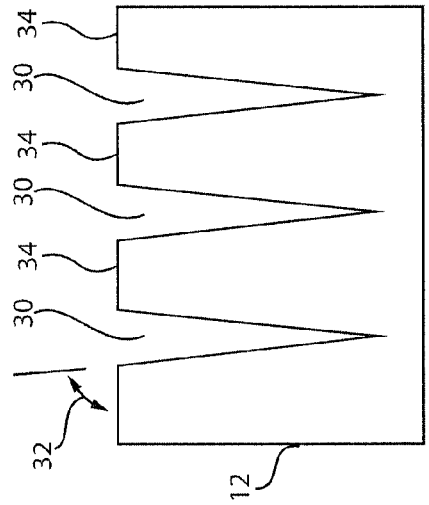
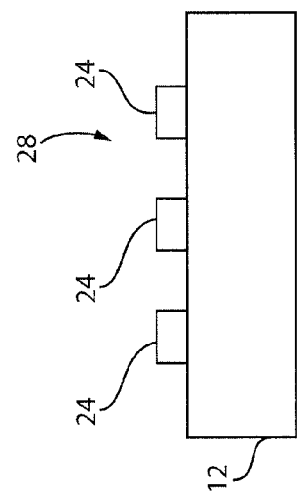

CONE-SHAPED HOLES FOR HIGH EFFICIENCY THIN FILM SOLAR CELLS

BACKGROUND

Technical Field

The present invention relates to photovoltaic devices, and more particularly to devices and methods for improving performance using cone-shaped holes in a substrate on which a photovoltaic stack is formed.

Description of the Related Art

Solar devices employ photovoltaic cells to generate current flow. Photons in sunlight hit a solar cell or panel and are absorbed by semiconducting materials, such as silicon. Carriers gain energy allowing them to flow through the material to produce electricity. The solar cell converts the solar energy into a usable amount of electricity.

When a photon hits silicon, the photon may be transmitted through the silicon, reflect off the surface, or be absorbed by the silicon, if the photon energy is higher than the silicon band gap value. This generates an electron-hole pair and sometimes heat, depending on the band structure.

When a photon is absorbed, its energy is given to a carrier in a crystal lattice. Electrons in the valence band may be excited into the conduction band, where they are free to move within the semiconductor. The bond that the electron (s) were a part of form a hole. These holes can move through the lattice creating mobile electron-hole pairs.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

SUMMARY

A photovoltaic device includes a substrate having a plurality of hole shapes formed therein. The plurality of hole shapes each have a hole opening extending from a first surface and narrowing with depth into the substrate. The plurality of hole shapes form a hole pattern on the first surface, and the hole pattern includes flat areas separating the hole shapes on the first surface. A photovoltaic device stack is formed on the first surface and extends into the hole shapes.

A substrate includes a plurality of hole shapes formed therein. The plurality of hole shapes each has a hole opening extending from a first surface and narrowing with depth into the substrate. The plurality of hole shapes forming a hole pattern on the first surface, and the hole pattern includes flat areas separating the hole shapes on the first surface.

A method for fabricating a substrate for photovoltaic device applications includes applying a resist on a first surface of the substrate; lithographically exposing and developing the resist to create a pattern of cross-linked areas in the resist; depositing a metal on the pattern and on exposed portions of the substrate; removing the pattern of cross-linked areas in the resist by a lift-off process to leave the metal on the substrate in the exposed portions of the substrate; dry etching the substrate using the metal on the substrate as an etch mask to form a plurality of hole shapes in the substrate, the plurality of hole shapes each having a hole opening extending from a first surface of the substrate and narrowing with depth into the substrate; and removing the metal to expose flat areas separating the hole shapes on the first surface.

A method for fabricating a photovoltaic device includes applying a resist on a first surface of the substrate; lithographically exposing and developing the resist to create a pattern of cross-linked areas in the resist; depositing a metal on the pattern and on exposed portions of the substrate; removing the pattern of cross-linked areas in the resist by a lift-off process to leave the metal on the substrate in the exposed portions of the substrate; dry etching the substrate using the metal on the substrate as an etch mask to form a plurality of hole shapes in the substrate, the plurality of hole shapes each having a hole opening extending from a first surface of the substrate and narrowing with depth into the substrate; removing the metal to expose flat areas separating the hole shapes on the first surface; and forming a photovoltaic device stack on the substrate.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1A is a cross-sectional view of a substrate having a resist layer thereon in accordance with the present principles;

FIG. 1B is a cross-sectional view of the substrate of FIG. 1A having cross-linked polymer of the resist layer remaining after development in accordance with the present principles;

FIG. 1C is a cross-sectional view of the substrate of FIG. 1B having a metal formed on the cross-linked polymer of the resist layer and in contact with the substrate in exposed areas in accordance with the present principles;

FIG. 1D is a cross-sectional view of the substrate of FIG. 1C showing a metal pattern formed on the substrate in accordance with the present principles;

FIG. 1E is a cross-sectional view of the substrate of FIG. 1D showing cone-shaped holes formed in the substrate in accordance with the present principles;

DETAILED DESCRIPTION OF PREFERRED EMBODIMENTS

Figure 2A:
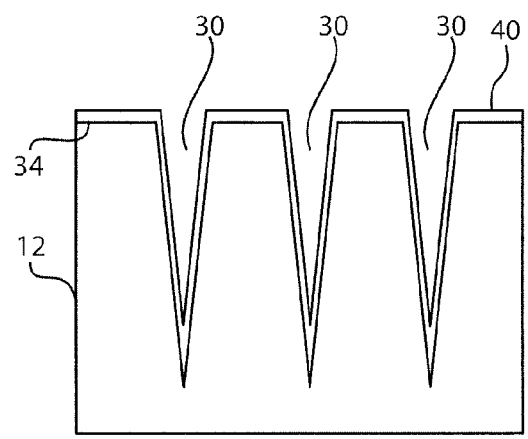
FIG. 2A is a cross-sectional view of the substrate of FIG. 1E having an electrode layer deposited on the substrate in accordance with the present principles.

The present principles provide photovoltaic devices and methods for fabrication that have improved absorption of incident radiation. For high efficiency silicon solar cells, increased surface area maximizes absorption of light spectra. In one embodiment, a lithographic pattern may be employed to provide spaced holes in a wafer or substrate, for example, a silicon-based substrate by an etching process. Glass or other silicon-based substrate materials may be employed for the substrate. The holes formed in accordance with the present principles may include planar or flat areas therebetween. The formation of the holes in accordance with the present principles permits greater uniformity throughout the device. The holes may be employed for further forming p-i-n diode layers or other layers for the formation of a photovoltaic cell or cells.

By forming holes in the substrate rather than growing rods or etching peaks, a significant amount of robustness is achieved in integrating a solar cell with holes as compared to solar cells made on cone shape pillars or other protruding structures. Dry etching by a reactive ion etch (RIE) creates sloped walls to provide inverted cone-shaped holes in the substrate. The geometry (slope) can be controlled using operating pressure and power.

In other embodiments, multi junction cells may be employed to achieve superior carrier collection efficiency. Multi junction cells include two or more cells stacked on top of each other. Any radiation transmitted through a top cell has a chance of being absorbed by a lower cell.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It is also to be understood that the present invention will be described in terms of given illustrative architectures for a solar cell; however, other architectures, structures, substrate materials and process features and steps may be varied within the scope of the present invention. A circuit or device formed using these structures as described herein may be part of a design for a photovoltaic device, which may take the form of an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices or chips. The resulting device can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1A, a process for forming cone-shaped holes in a substrate 12 is illustratively shown. The substrate 12 may include a glass material, silicon material (e.g., a monocrystalline silicon, quartz or an amorphous silicon). While other substrate materials may be employed silicon based materials including glass are preferred. In one embodiment, a resist layer 14 is deposited over the substrate 12. The resist layer 14 may include a photoresist although resists responsive to electrons and other forms of radiation may also be employed.

The photoresist material of layer 14 may include a chemically amplified photoresist, a non-chemically amplified photoresist, a positive-tone or a negative tone resist. Processing of resist layer 14 may include a deposition process including, for example, spin-on-coating, dip coating, brush coating, and ink-jet dispensing. After applying the resist layer 14, a post deposition baking step may be performed to remove unwanted components, such as solvent. When performed, the baking step is conducted at a temperature from about 40° C. to about 200° C., with a baking temperature from about 60° C. to about 140° C. being preferred. The duration of the baking step may vary from about 10 seconds to about 600 seconds.

The resist layer 14 may have a thickness from 1 nm to 50,000 nm, with a thickness from about 500 nm to about 5000 nm being preferred. The pattern-wise exposing process can be accomplished in a variety of ways, including, for example, exposure through a mask with a lithography stepper or a scanner with an exposure light source of G-line, I-line (365 nm), DUV (248 nm, 193 nm, 157 nm, 126 nm), Extreme UV (EUV) (13.4 nm, 6.5 nm), an electron beam, an ion beam, etc. The exposing process may be performed in a dry mode or an immersion mode. The exposing process may be performed with a single exposure or multiple exposures. The pattern-wise exposing process may include direct writing without the use of a mask with, for example, light, electron beam, ion beam or scanning probe lithography. Other patterning techniques that can be used include contact printing techniques such as nanoimprint lithography, embossing, micro contact printing, replica molding, microtransfer molding, micromolding in capillaries, solvent-assisted micromolding, thermal assisted embossing, inject printing, etc.

The resist layer 14 is exposed to form exposed areas 16 and unexposed areas 18. Depending on the type of resist employed (e.g., a positive or negative-tone photoresist), one of the exposed areas 16 and the unexposed areas 18 is caused to cross-link. For illustrative purposes, the exposed areas 16 will be cross-linked, in this example. The non-cross-linked portions (unexposed areas 18 in this case) are formed as shapes in the resist layer 14 surrounded by the exposed areas 16. The shapes may include dots or circles having a diameter of greater than about 500 nm, and preferably greater than about 1 micron. Other shapes may include squares, rectangles, etc. The shapes may be spaced apart on a pitch of between about 500 nm and about 1 micron. Other dimensions are also contemplated. Other masks and/or mask patterning techniques may be employed in addition to or instead of those described herein.

Referring to FIG. 1B, after exposure and cross-linking, latent images or patterns are developed with an appropriate developer, e.g., using acetone or an aqueous based solution, such as, e.g., 0.26N tetramethylammoniahydroxide (TMAH) solution for between about 20 and about 60 seconds. Other developers and durations may also be employed and may depend on concentration, temperatures, materials and other factors. The developer removes unexposed areas 18 leaving exposed areas 16 on the substrate 12. Since the exposed areas 16 are patterned using lithographic methods, pattern features may be formed with a plurality of different shapes. In one embodiment, the pattern created includes openings 20 that may be shaped like a circle, square, rectangle, etc. for forming holes as will be described in greater detail herein.

Referring to FIG. 1C, a metal layer 24 is deposited over the remaining portions of the resist layer (e.g., exposed areas 16) and exposed portions of the substrate 12 in openings 20. The metal layer 24 may include Chromium, Tungsten, Copper, Aluminum, Tin, etc. or alloys thereof. In addition other materials may be employed to form a mask for later etching of the substrate 12 as will be described. The metal layer 24 may be deposited by a chemical vapor deposition (CVD), physical vapor deposition (PVD), evaporative deposition, sputtering etc. Other deposition techniques may also be employed. The metal layer may include thickness of between about 100 nm to about 1000 nm depending on the desired depth.

The metal layer 24 is preferably deposited so that the metal layer covers top portions of the exposed portions 16 and portions of the substrate 12 within openings 20. It is preferable that portions 26 of sidewalls of the resist layer 14 remain exposed to facilitate removal of the remaining resist material 16 in later steps. The metal layer 24 at the bottom of the openings 20 is distributed in accordance with the lithographic pattern and may be symmetrically or asymmetrically formed in accordance with the pattern.

Referring to FIG. 1D, the resist 16 is removed from the substrate 12. The resist 16 may be removed by a lift-off process, which may include removing the resist 16 such that when the resist 16 is washed away (e.g., in a solvent), the material (metal layer 24) on the top of the resist 16 is lifted-off and washed together with the resist 16 in contact with the substrate 12. After the lift-off, the metal layer 24 remains only in the regions where it had direct contact with the substrate 12, i.e., at the bottom of the opening 20. An etch pattern 28 is formed by the remaining portions of the metal layer 24. The lift-off solvent may include acetone, toluene or Piranha (e.g., a 3:1 mixture of sulfuric acid ($H_2SO_4$) and hydrogen peroxide ($H_2O_2$)). Other solvents may also be employed.

Referring to FIG. 1E, an etch process is employed using the etch pattern 28 to etch away the substrate 12 to forms holes 30 therein. The etch process may include a dry etch utilizing an etch gas chemistry appropriate for etching substrate 12 with respect to the pattern 28. The dry etch preferably includes a reactive ion etch (RIE) process so that the depth to width ratio is high for holes 30 formed as a result of the etch process. Etch depth may be between about 200 nm to about 4 microns, although deeper holes 30 may also be formed. The holes 30 may include a diameter of greater than about 2 microns and may be spaced apart on a pitch of between about 500 nm and 2 microns. Other dimensions are also contemplated.

The dry etch using reactive ion etching (RIE) may be tuned to provide a tapered structure for the holes 30. Pressure and power can be tuned to provide conical shapes for the holes. In one embodiment, a desirable pressure range during dry etch is between about 100 m Torr and about 300 m Torr, and a desirable power range is between about 200 Watts to about 400 Watts. The dry etching may be employed to remove the remaining portions of the metal 24, or a separate process may be employed.

In one embodiment, the holes 30 assist in increasing the surface area of absorption and provide for radiation trapping between the holes 30. The holes 30 with larger than 1:2 (width to height) aspect ratio are preferred for enhanced light absorption. The holes 30 extend into the substrate 12 as a conical shape. The conical holes 30 form a taper angle 32 of between about 60 degrees to up to about 90 degrees. Other methods for forming conical holes 30 may also be employed.

Areas surrounding the holes 30 include flat areas or flat sections 34. The flat areas 34 are planar areas that substantially maintain an original surface of the substrate 12. The structure of FIG. 1E is employed to form a p-type layer-intrinsic layer-n-type layer (p-i-n) stack structure of a photovoltaic device as will be described. These flat areas 34 provide robustness to the structure and provide electrical integrity to p-i-n (or n-i-p) stacks when formed by ensuring the electrical continuity to electronic components formed in the plurality of holes 30 surrounding the flat are 34.

Figure 2B:
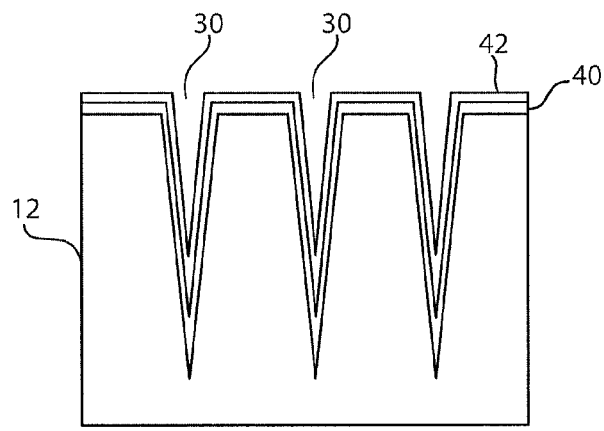
FIG. 2B is a cross-sectional view of the substrate of FIG. 2A showing a p-i-n diode stack formed on the electrode layer in accordance with the present principles.
Figure 2C:
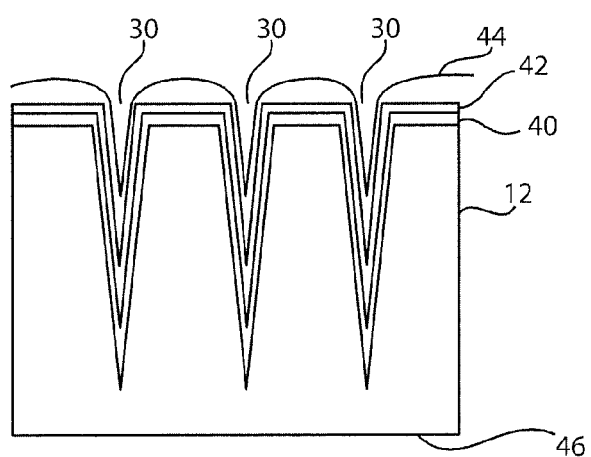
FIG. 2C is a cross-sectional view of the substrate of FIG. 2B showing another electrode formed on the p-i-n stack in accordance with the present principles.

Referring to FIGS. 2A-2C and in particular to FIG. 2A, a process of forming an amorphous silicon solar cell is illustratively shown in accordance with another embodiment. It should be understood that the substrate 12 employed in this process includes a transparent material, such as glass; however, silicon or other substrate materials may be employed. In the present case, the substrate 12 has been processed in a same manner as described with respect to, FIGS. 1A-1E.

A first electrode layer 40 is formed on flat areas 34 and in holes 30 by a deposition process. The first electrode layer 40 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a chemical vapor deposition (CVD) process or other suitable deposition process.

Referring to FIG. 2B, a p-i-n (or n-i-p) diode stack 42 is formed over the first electrode 40. The stack 42 preferably includes a first doped layer (p-doped layer), an intrinsic layer (i-layer) and a second doped layer (n-doped layer). The polarity of the doped layers may be reversed (n-i-p). The stack 42 may be formed using a CVD or plasma enhanced CVD (PECVD) process. The stack 42 provides active areas for absorbing radiation and converting the radiation into charge flow as is known in the art. A plurality of different materials may be selected for the layers in stack 42. In one particularly useful embodiment, the first and second doped layers may include doped polycrystalline/microcrystalline silicon and the intrinsic layer may include undoped amorphous silicon. Other materials and material combination may be employed for the p-i-n stack 42.

Referring to FIG. 2C, a second or bottom electrode 44 is formed on the stack 42. The second electrode 44 may include a transparent conductive material such as a transparent conductive oxide (e.g., zinc oxide, indium tin oxide, indium zinc oxide, etc.), ultra-thin metal (e.g., 20 nm or less in thickness) or other conductive structure. The deposition process may include a CVD, PECVD or other suitable deposition process. One of the two conductive electrodes may include an opaque material (and may be reflective) depending on the orientation of the photovoltaic device and its use (e.g., incident light direction).

The holes 30 assist in increasing the surface area of absorption and provide for radiation trapping between the conical shapes portions of the holes 30. The structures depicted in FIGS. 2A-2C may be constructed to receive light with the holes 30 pointing out (e.g., toward the light) where a surface 46 of the substrate 12 acts as a top surface of the photovoltaic device. In other embodiments, the top surface may be opposite surface and the layers 40, 42 and 44 may be reversed. The holes 30 increase the surface area and therefore the collection efficiency in any incident light direction as compared with a planar surface cell.

Figure 3:
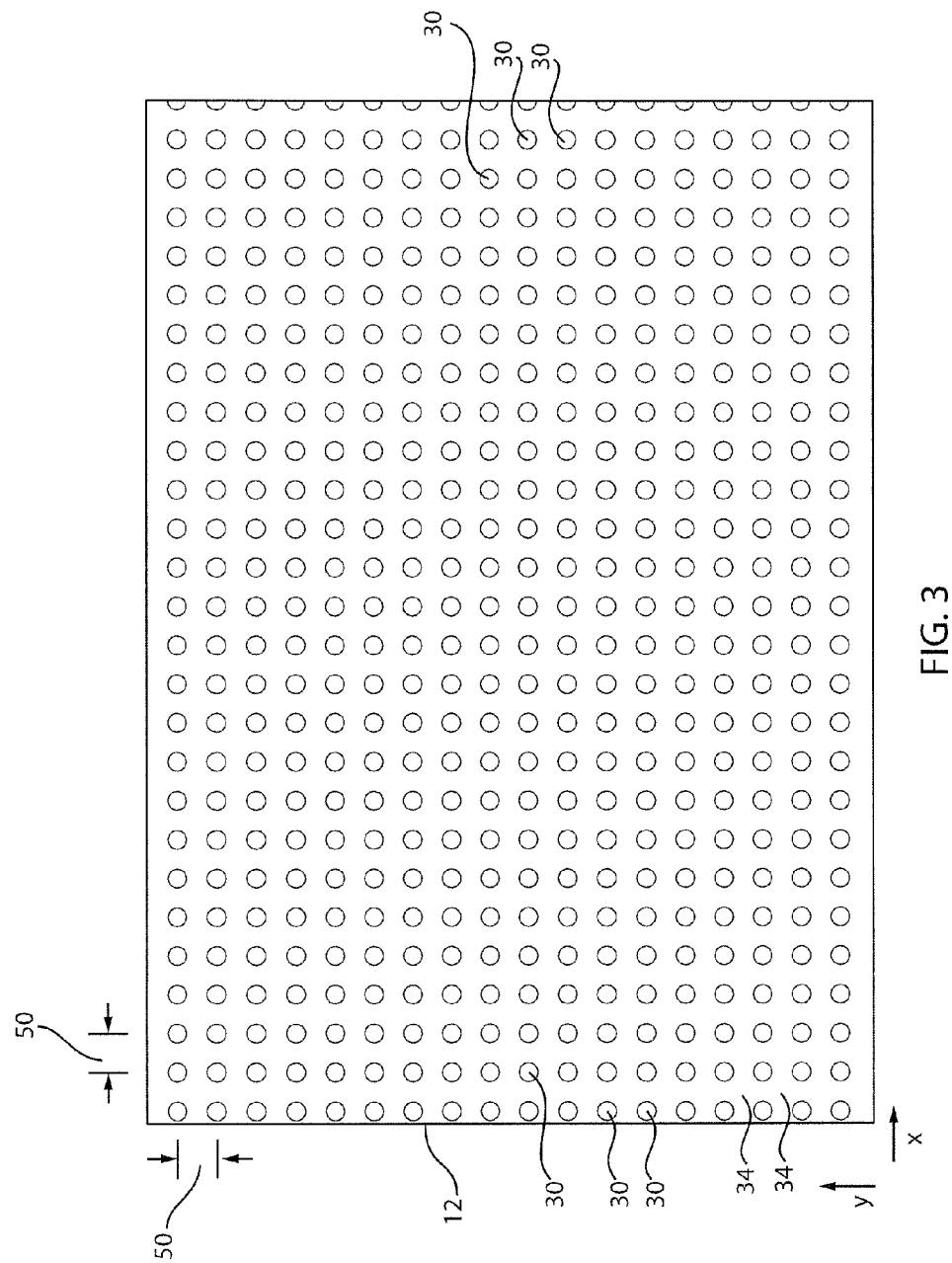
FIG. 3 is a top view of a substrate showing an array of holes formed therein in accordance with the present principles.

Referring to FIG. 3, a top view of the substrate 12 is shown having conical holes 30 formed therein. The flat regions 34 are disposed between the holes 30 and permit the proper formation of the electrodes 40, 44 and the p-i-n stack 42 between holes 30. Holes 30 increase the surface area of the layers 40, 42, 44 and in many embodiments significantly increase the surface area. Since lithographic patterning is employed, the hole patterns may include a plurality of shapes and sizes. In some embodiments, a plurality of different shapes and sizes may be employed on the same device. For example, at edges of the device the holes 30 may be made larger, or the holes may be square-shaped, etc.

As depicted in FIG. 3, the hole patterns include holes 30 that are equidistant in two dimensions (e.g., x and y directions). A pitch 50 in the x direction is equal to the pitch 52 in the y-direction in this example. It should be understood that the pitches 50 and 52 may not be equal. There may also be a plurality of different pitches throughout the device and the pitches along different axes may be different or varied (e.g., gradually increase with distance, alternately change pitch, etc.).

The substrate 12 may be formed on a larger scale wafer. The larger wafer may include a size that is larger than standard semiconductor wafers (e.g., greater than about 5-6 inches). The substrate 12 may be provided to manufacturers of solar cells. The manufacturers may employ reduced sizes by dicing the substrate 12, e.g., laser dicing. The larger substrate 12 can be diced to create smaller substrates for smaller solar cells.

Figure 4:
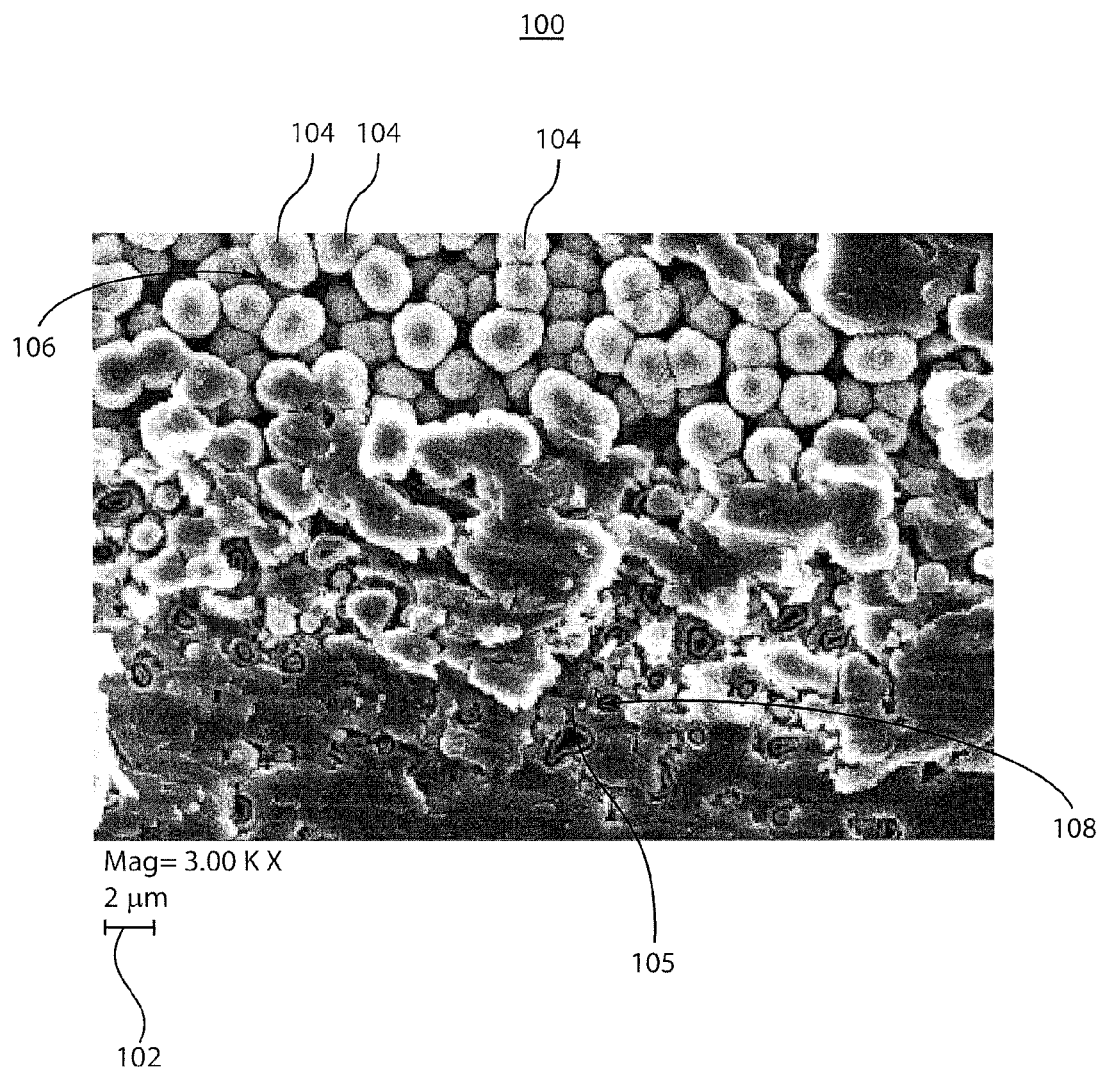
FIG. 4 is a scanning electron microscope (SEM) image of a pillar structure solar cell to demonstrate damage incurred by a conventional probe contact measurement.

Referring to FIG. 4, a scanning electron microscope (SEM) image of a solar cell 100 is shown with a magnification of 3000 times. A scale 102 indicates 2 microns. The image demonstrates the effect of probe measurements and handling on the solar cell 100. The solar cell 100 includes pillars 104 instead of holes and flats, as provided in accordance with the present principles. During testing and handling, the pillars 104 which normally are configured as shown in area 106 become damaged as shown in area 108. Area 108 has been damaged by a test probe in attempting to contact the solar device surface to make measurements. Pillars 105 are broken off or damaged. The extensive damage as depicted is difficult to avoid even with a thick deposition of a final conductive electrode. Such a thick deposition is time consuming and also adds expense.

In accordance with the present principles, a much more robust structure is provided. The strength of the substrate with holes, in accordance with the present principles, is employed to provide sufficient resistance to probes for electrical measurements, and the damage experienced with the pillar structures is greatly diminished and even eliminated. The flat areas provide a good probe target and provide resistance to probe damage. In addition, the flats permit there to be sufficient electrical continuity to component layers formed in the surrounding holes. This results in cost savings and increased reliability.

Figure 5:
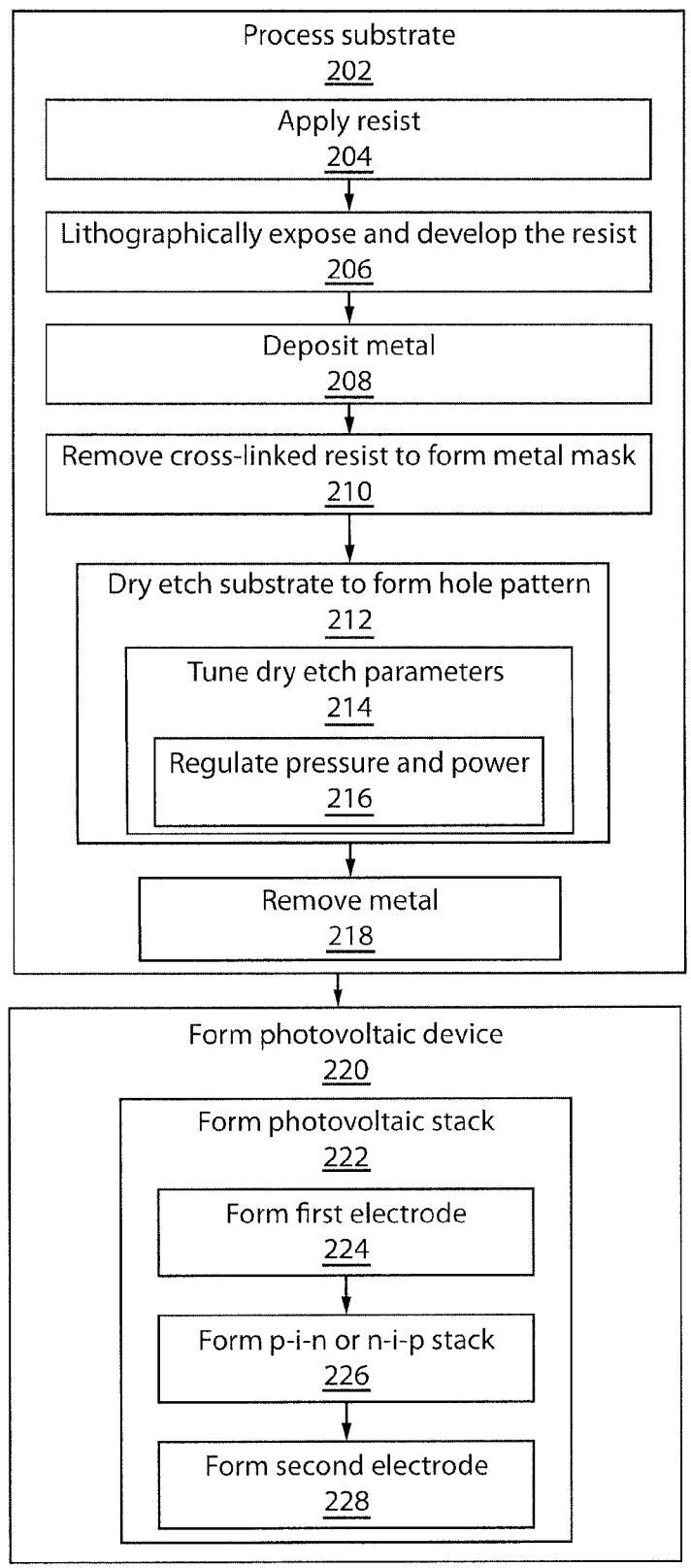
FIG. 5 is a block/flow diagram showing a method for fabricating a photovoltaic device in accordance with one illustrative embodiment.

Referring to FIG. 5, a method for fabricating a photovoltaic device is illustratively depicted in accordance with particularly useful embodiments. In block 202, a substrate is processed. The substrate may include materials such as, e.g., single crystalline silicon, multi-crystalline silicon, amorphous silicon, glass, quartz or other suitable materials. The processing of the substrate includes the following. In block 204, a resist is applied on a first surface of the substrate. This may be performed by a plurality of different processes including a spin-on process or other deposition process. In block 206, the resist is lithographically exposed and developed to create a pattern of cross-linked areas in the resist. The non-cross-linked pattern is removed by the development process (e.g., using acetone, etc.). The remaining pattern in the resist will define the size, shape, pitch, etc. of holes to be formed in the substrate. The plurality of hole shapes may include an opening dimension of e.g., 500 nm or greater.

In block 208, a metal is deposited on the pattern and on exposed portions of the substrate. The metal may be deposited using an evaporative method. The metal may include at least one of Aluminum or Chromium. Other metals may also be employed.

In block 210, the pattern of cross-linked areas in the resist is removed by a lift-off process to leave the metal on the substrate in the exposed portions of the substrate. In block 212, the substrate is dry etched using the metal on the substrate as an etch mask to form a plurality of hole shapes in the substrate. The plurality of hole shapes each have a hole opening extending from a first surface of the substrate and narrowing with depth into the substrate. In block 214, the dry etching may include tuning a reactive ion etch (RIE) to form a tapered structure in the hole openings. The tapered structure may include a cylindrical cone, a pyramidal cone, etc. The tapered structure may or may not come to a point at its apex. In one embodiment, in block 216, the tuning of parameters may include regulating pressure between about 100 mTorr and about 300 mTorr and power between about 200 Watts to about 400 Watts to achieve a desired slope of the tapered structure.

In block 218, the metal is removed to expose flat areas separating the hole shapes on the first surface. The processed substrate may be distributed to manufacturers or employed to form a photovoltaic device. The substrate may be diced to form smaller substrates.

In block 220, the substrate is further processed to form a photovoltaic device. In block 222, a photovoltaic device stack is formed on the substrate. The photovoltaic device stack includes forming a first transparent conductive layer disposed on the substrate in block 224, forming a p-i-n or n-i-p stack disposed on the first transparent conductive layer in block 226; and forming a second conductive layer formed on the p-i-n or n-i-p stack in block 228. Note that the p-i-n stack is preferably formed when employing a glass substrate and the n-i-p stack is preferably formed when employing a silicon substrate. It should be understood that additional layers may be employed for the device stack, and the device stack may include different materials and/or thickness depending on the application and design. In one embodiment, a tandem cell or additional layers may be formed to provide a plurality of photovoltaic cells in a stack.

Having described preferred embodiments inverted cone-shaped holes for high efficiency thin film solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
a substrate having a plurality of hole shapes formed therein, the plurality of hole shapes each having a hole opening extending from a first surface and narrowing with depth into the substrate, the plurality of hole shapes forming a hole pattern on the first surface, the hole pattern including flat areas separating the hole shapes on the first surface, wherein each of the hole openings has a pitch relative to adjacent hole openings which varies depending on a position of the hole opening along at least one axis on the substrate; and
a photovoltaic device stack formed on the first surface and extending into the hole shape, the photovoltaic device stack including at least an n-doped layer of polycrystalline silicon or microcrystalline silicon, an intrinsic layer of undoped amorphous silicon, and a p-doped layer of polycrystalline silicon or microcrystalline silicon, wherein at least a portion of n-doped layer, the intrinsic layer, and the p-doped layer is present in the plurality of hole shapes.

2. The device as recited in claim 1, wherein the hole shapes include a conical shape defining a taper angle with the first surface.

3. The device as recited in claim 2, wherein the taper angle is between about 60 degrees and 90 degrees relative to the first surface.

4. The device as recited in claim 1, wherein the pitch is varied in a range between about 500 nm and about 2 microns between holes shapes.

5. The device as recited in claim 1, wherein a hole depth is between about 200 nm and about 4 microns.

6. The device as recited in claim 1, wherein the substrate includes one or more of amorphous silicon, glass, crystalline silicon or quartz.

7. The device as recited in claim 1, wherein one or more of the hole shapes taper to a point.

8. The device as recited in claim 1, wherein the photovoltaic device stack includes:
a first conductive layer disposed on the substrate;
a p-i-n or n-i-p stack disposed on the first conductive layer; and
a second conductive layer formed on the p-i-n or n-i-p stack.

9. The device as recited in claim 8, wherein the second conductive layer includes a convex surface disposed over the flat areas.

10. The device as recited in claim 1, wherein portions of the first surface of the substrate are coplanar with each other.

11. The device as recited in claim 1, wherein the taper angle is between about 64 degrees and 90 degrees relative to the first surface.

12. A substrate, comprising:
a plurality of hole shapes formed therein, the plurality of hole shapes each having a hole opening extending from a first surface and narrowing with depth into the substrate, the plurality of hole shapes forming a hole pattern on the first surface, the hole pattern including flat areas separating the hole shapes on the first surface, wherein each of the hole openings has a pitch relative to adjacent hole openings which varies depending on a position of the hole opening along at least one axis on the substrate, the hole shapes containing a stack of semiconductor material, the stack of semiconductor material at least an n-doped layer of polycrystalline silicon or microcrystalline silicon, an intrinsic layer of undoped amorphous silicon, and a p-doped layer of polycrystalline silicon or microcrystalline silicon, wherein at least a portion of n-doped layer, the intrinsic layer and the p-doped layer is present in the plurality of hole shapes.

13. The substrate as recited in claim 12, wherein the hole shapes include a conical shape defining a taper angle with the first surface.

14. The substrate as recited in claim 13, wherein the taper angle is between about 60 degrees and 90 degrees relative to the first surface.

15. The substrate as recited in claim 12, wherein the pitch is varied in a range between about 500 nm and about 2 microns between holes shapes.

16. The substrate as recited in claim 12, wherein a hole depth is between about 200 nm and about 4 microns.

17. The substrate as recited in claim 12, wherein the substrate includes one or more of amorphous silicon, glass, crystalline silicon or quartz.

18. The substrate as recited in claim 12, wherein portions of the first surface of the substrate are coplanar with each other.

19. The substrate as recited in claim 12, wherein the taper angle is between about 64 degrees and 90 degrees relative to the first surface.

20. The substrate as recited in claim 12, further comprising a conductive layer formed on the stack of semiconductor material, wherein the conductive layer includes a convex surface disposed over the flat areas.

* * * * *